US006816007B1

United States Patent
Sahyoun

(10) Patent No.: US 6,816,007 B1
(45) Date of Patent: Nov. 9, 2004

(54) AMPLIFIER WITH DYNAMIC RAIL CONTROL DRIVE CIRCUIT

(76) Inventor: Joseph Y. Sahyoun, 3031 Hopkins Ave., Redwood City, CA (US) 94062

(*) Notice: Subject to any disclaimer, the term of this patent is extended or adjusted under 35 U.S.C. 154(b) by 0 days.

(21) Appl. No.: 10/209,441

(22) Filed: Jul. 29, 2002

Related U.S. Application Data

(60) Provisional application No. 60/308,513, filed on Jul. 27, 2001.

(51) Int. Cl.$^7$ .............................................. H03F 3/38
(52) U.S. Cl. ........................................ 330/10; 332/117
(58) Field of Search ....................... 330/10, 166, 170; 332/144, 117

(56) References Cited

U.S. PATENT DOCUMENTS

| 4,054,843 A | 10/1977 | Hamada | 330/263 |
| 4,178,556 A | 12/1979 | Attwood | 330/10 |
| 4,218,660 A | 8/1980 | Carver | 330/297 |
| 4,479,175 A | 10/1984 | Gille et al. | 363/41 |
| 4,484,150 A | 11/1984 | Carver | 330/297 |
| 4,878,163 A | * 10/1989 | Yamato et al. | 363/8 |
| 4,992,751 A | 2/1991 | Attwood | 330/10 |
| 5,541,827 A | * 7/1996 | Allfather | 363/17 |

* cited by examiner

Primary Examiner—Linh M. Nguyen
(74) Attorney, Agent, or Firm—Allston L. Jones

(57) ABSTRACT

The amplifier of the present invention causes variations in the rail voltage that are controlled by the frequency of the audio signal being amplified as the audio signal changes. This is done to tune the operation of the amplifier taking into consideration the frequency response of the human ear. By doing so, the resulting amplifier is more efficient at lower frequencies where more signal distortion is required before it can be heard by the human ear, and a higher quality signal output is provided at higher frequencies where the human ear can more readily detect distortion. Thus by designing the amplifier from the listener's point of view results in an amplifier with much improved performance from both technical and listener points of view.

13 Claims, 12 Drawing Sheets

FREQUENCY RANGE OF MUSICAL INSTRUMENTS AND VOCALS

AMPLIFIER WITH DYNAMIC RAIL CONTROL DRIVE CIRCUIT

CROSS REFERENCE

This application claims benefit from Provisional Patent application having Ser. No. 60/308,513 filed Jul. 27, 2001.

BACKGROUND OF THE INVENTION

1. Field of the Invention

The present invention is related generally to audio amplifiers, and more specifically to an amplifier that automatically enhances the efficiency and quality of the response of the output signal in various audio frequency ranges that are audible to the human ear.

2. Description of Related Art

It is well known that to the human ear the amount of distortion that is discernable is different for different audio frequency ranges. At low frequencies a much greater amount of distortion must be present before a listener can hear it as compared to the amount of distortion that can be discerned at frequencies in the 1000 Hz range. Additionally, low frequency speakers are slow to respond to music due to the mechanical design, size and weight of the component parts of the speaker thus distortion is often rendered inaudible (i.e., low frequency speakers are physically large in size). This fact, coupled with the characteristics of the human ear at low frequencies, permits the audio signal to include a much higher percentage of distortion before it can be heard by a listener. Thus at lower frequencies, efficiency of the audio system is more important than the quality of the sound produced.

However, at higher frequencies, where the human ear is better able to distinguish between sounds, speakers designed to reproduce sound in that frequency range are also much more responsive to the audio signal applied to them due in large part to the light weight of the component parts of the speaker (i.e., the higher the frequency the speaker is physically small in size). This improved speaker response to the applied signal results in the speaker being much less likely to mask distortions in the audio signal than their low frequency speaker counterparts. These two factors, human ear and speakers each being more responsive to higher frequencies in the 1000 Hz range creates a challenge to the designer to minimize distortion in the audio signal delivered to the higher frequency speakers. Therefore in this frequency range the quality of the sound produced is of critical importance.

Since the moving mass (i.e., speaker cone and coil) is much smaller in the range of 1000 Hz than in low frequency speakers, the higher range speakers almost instantaneously respond to small amplitude changes in the applied signal. These smaller amplitude changes are often not a part of the desired audio information (e.g., music). For example those small signal variations could be modulation noise in the signal or on the supply rail resulting from an amplifier, such as that of Hamada (U.S. Pat. No. 4,054,843), is known to have a lot of problems introduced by the modulation technique that is used. The Hamada amplifier basically tracks 100% of the audio signal at its feed. The Hamada amplifier simply cuts the voltage to a exact level that is dictated by the audio signal, regardless of the frequency of the signal and the frequency response of the speakers and the human ear. Therefore, at higher frequencies the Hamada amplifier becomes problematic for several reasons, for example, it inhibits and delays, to some extent, to prepare the amount of energy needed for the amplification when that energy is needed to be supplied on time and equal to the level needed to amplify the signal. This makes the task of the Hamada amplifier difficult and unachievable and compromising when it comes to distortion. Adding consideration of the sensitivity and frequency response of the human ear, the problems at the mid-range and higher audio frequencies are accentuated. Thus at these higher frequencies, more quality is needed in the sound amplification than efficiency.

Given the sensitivity of the human ear, much more amplification is needed below 100 Hz and less amplification at 1000 Hz, and depending on the listeners hearing response more or less amplification at 5000 Hz since the upper end sensitivity of the human ear varies dramatically from person to person. Thus, in the sub harmonic or the sub woofer range the ear needs more amplification and distortion is not audible as discussed previously, however any sensitive change of the amplifier at 1000 Hz is going to be clearly audible and compromise the sound reproduction quality of the amplifier. By tracking the audio signal exactly for all frequencies, as with the Hamada amplifier, and providing a fixed headroom for the signal, regardless of the frequency of the signal, the quality, or lack thereof, of sound reproduction is very evident.

What is needed is an amplifier that takes into consideration the differences in performance of speakers at different frequencies, as well as the natural variations in the frequency response of the human ear. The amplifier of the present invention provides such a doubly, automatically compensated amplifier.

SUMMARY OF THE INVENTION

The present invention provides several different embodiments each achieving the same results and improved performance over the prior art. The amplifier of the present invention causes variations in the rail voltage that are controlled by the frequency of the audio signal being amplified as the audio signal changes. This is done to tune the operation of the amplifier taking into consideration the frequency response of the human ear. By doing so, the resulting amplifier is more efficient at lower frequencies where more signal distortion is required before it can be heard by the human ear, and a higher quality signal output is provided at higher frequencies where the human ear can more readily detect distortion. Thus by designing the amplifier from the listener's point of view results in an amplifier with much improved performance from both technical and listener points of view.

DESCRIPTION OF THE EMBODIMENTS OF THE PRESENT INVENTION

The present invention is an amplifier and method of modulating the audio signal with a dynamic rail control circuit that changes the control variable based on the actual frequency of the input audio signal. More specifically, the present invention pertains to an amplifier in which the rail voltage is controlled to both minimize heat generation by the amplifier (i.e., efficiency) while at the same time compensating for the variations in human hearing to maximize the quality of the audible sound to the human listener (i.e., distortion). As will be seen from the discussion that follows, the control variable is selected to maximize efficiency at lower frequencies and to maximize quality at higher frequencies to over come the problems of the prior art.

Figure 6:
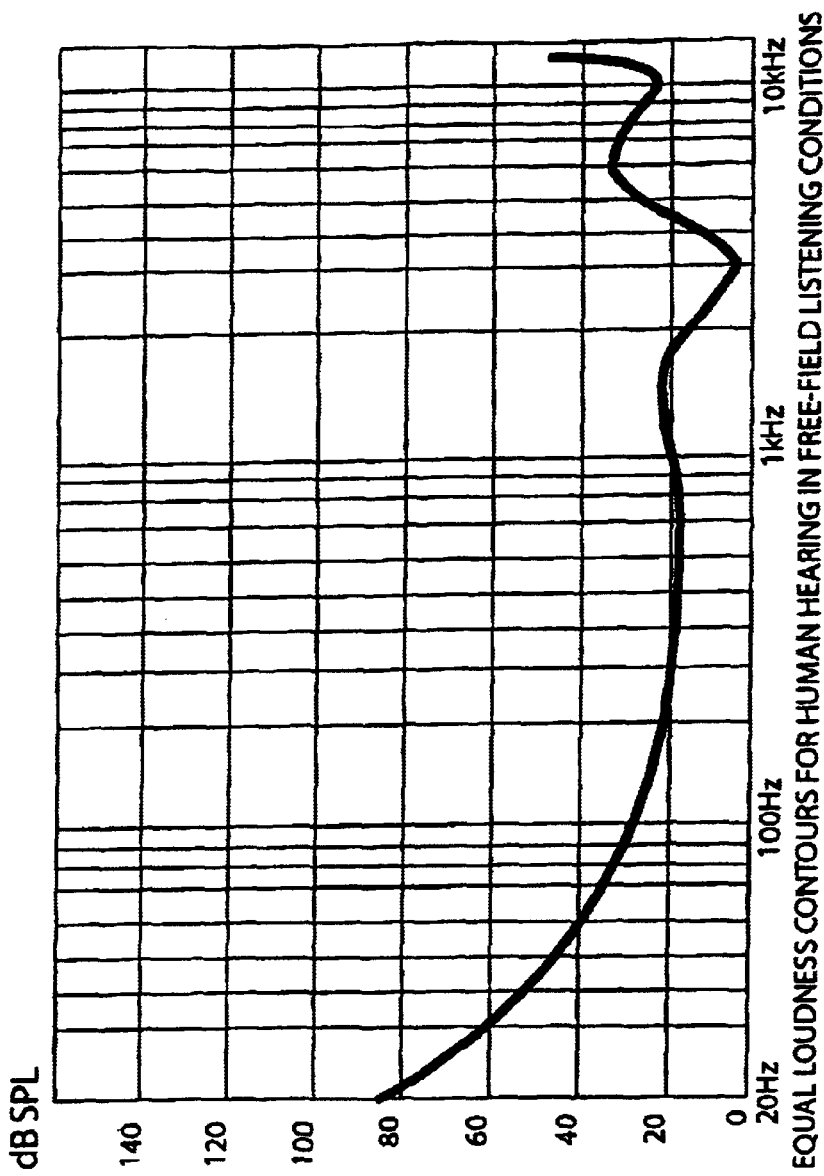
FIG. 6 is plot of a typical hearing response of the human ear in audio signal strength (dB) versus audio frequency.

FIG. 6 illustrates a typical hearing response of the human ear in audio signal strength (dB) versus audio frequency. It can be seen that for the signal to be heard by a listener with this hearing response curve would require a signal that is approximately 80 dB stronger at 20 Hz than at 3 kHz. It can also be seen that the typical hearing response curve is not a simple parabola, rather one that has three minimum and two maximum points between 20 Hz and 11 kHz. The minimums, though at different levels, occur at approximately 600 Hz, 3 kHz and 10 kHz, while the intermediate maximums, also at different levels, occur at approximately 1.6 kHz and 6 kHz.

Figure 7:
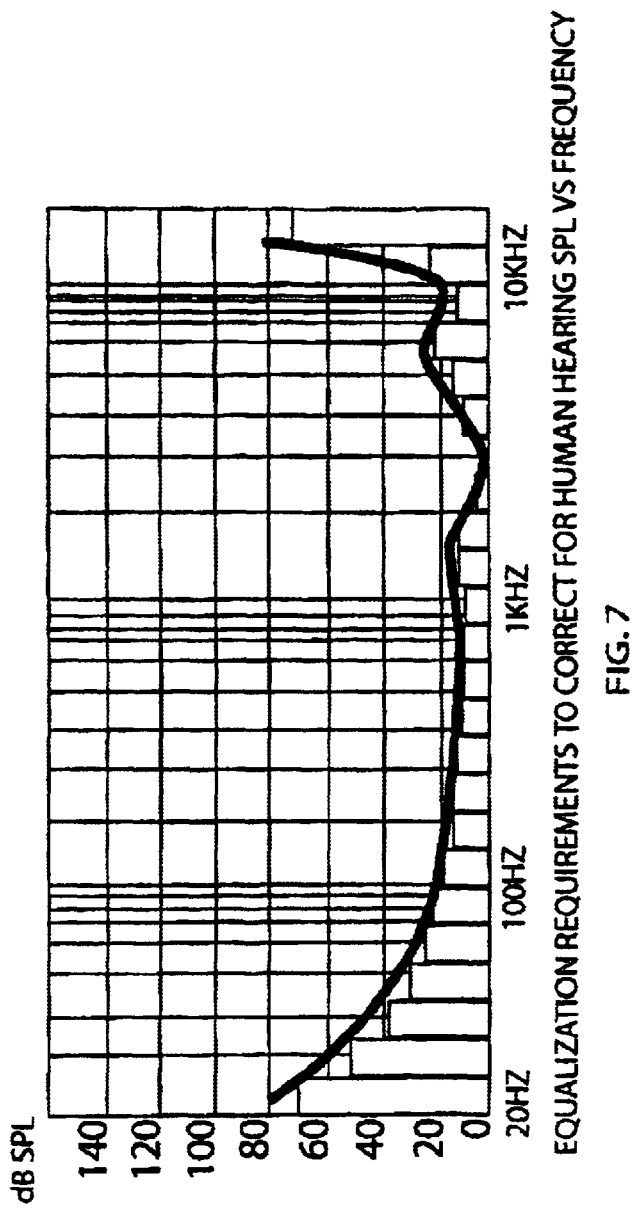
FIG. 7 is a plot that illustrates an equalization that would be needed to substantially correct for the variation in the human hearing response through the audible frequency range.

Then in FIG. 7, using the human audio response curve of FIG. 6, an equalization pattern is illustrated with 21 equalization steps to substantially correct for the variation in the human hearing response through the audible frequency range.

Figure 8:
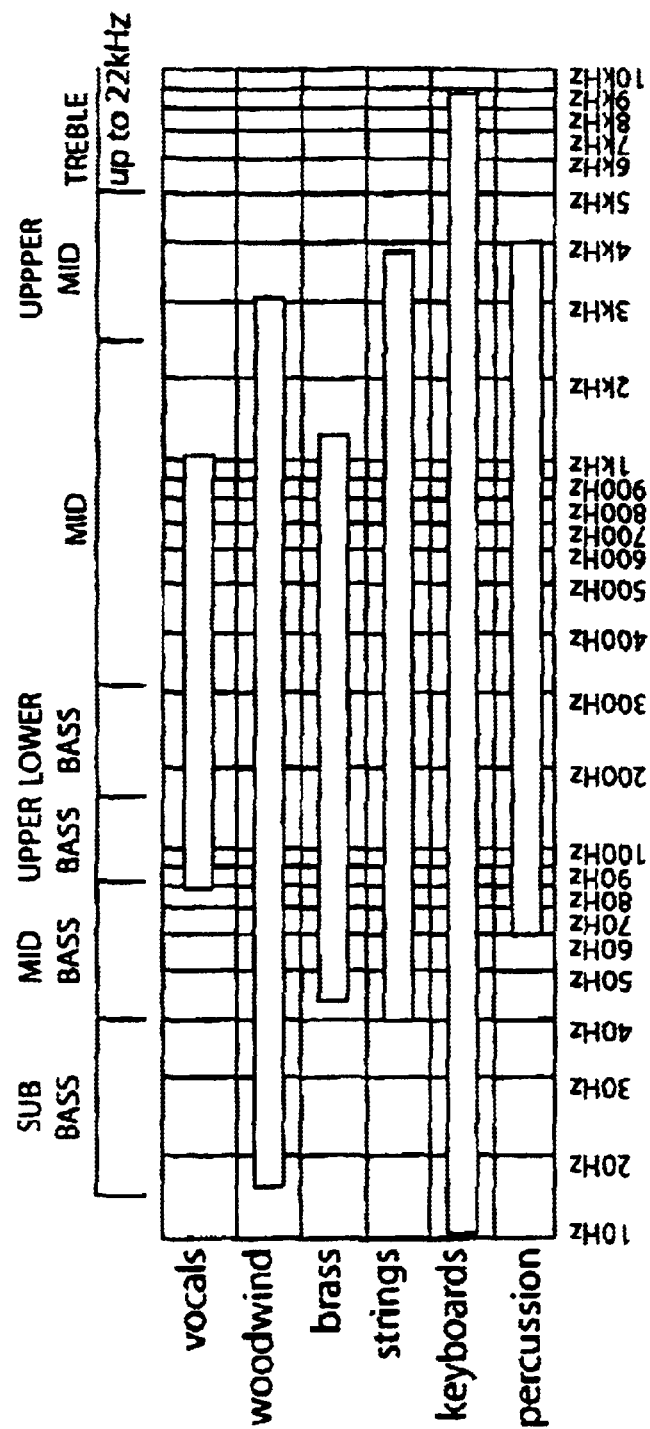
FIG. 8 is a plot that illustrates the frequency range of human and various instrument voices.

FIG. 8 is included for purposes of comparison of the audible range of the human voice and the voices of a variety of types of musical instruments. Note that woodwinds and keyboards are capable of producing tones at the lower frequencies where the human hearing response is marginalized. Similarly, keyboards have an extensive range that also includes tones in the upper frequency range where the human hearing response is also marginalized.

Figure 9:
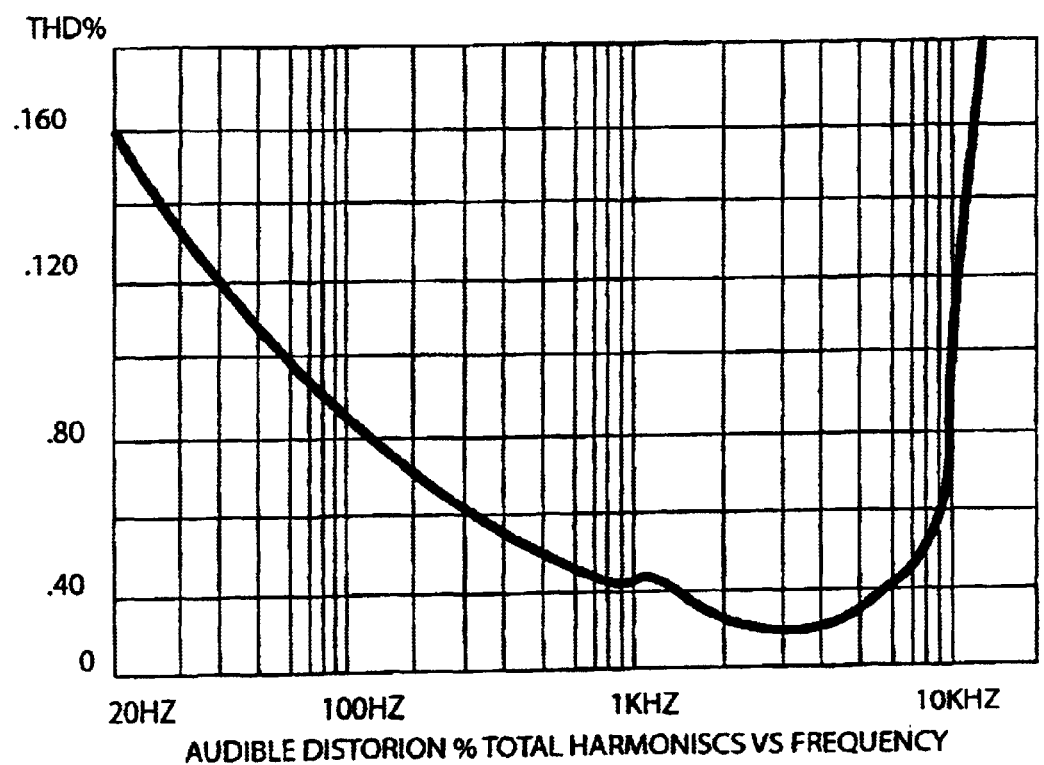
FIG. 9 is a plot that illustrates the sensitivity of the human ear to audio distortion as percent of the total harmonics of the sound over the typical audible frequency range of a human ear.

FIG. 9 illustrates the sensitivity of the human ear to audio distortion as percent of total harmonics over the typical audible frequency range of a human ear. From this plot it can be seen that efficiency of an amplifier could be more of a consideration at lower frequencies and definitely so at very high frequencies, whereas in the mid range of human hearing more emphasis needs to be paid to the quality of the sound produced to insure a pleasant listening experience for the amplifier purchaser.

Figure 10:
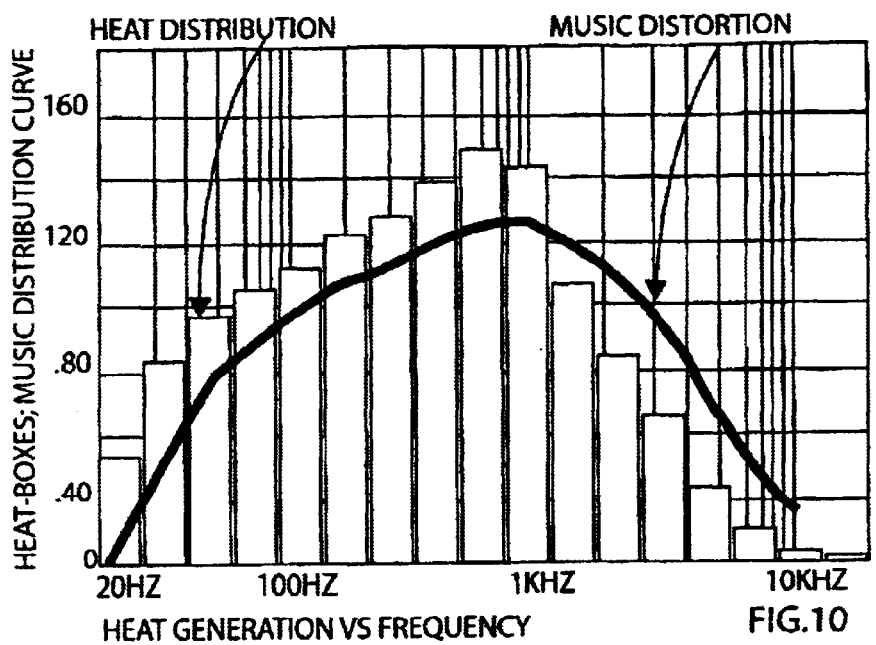
FIG. 10 is a plot that illustrates the heat generated by an amplifier that varies the rail voltage based only on the audio frequency of the music signal.
Figure 11:
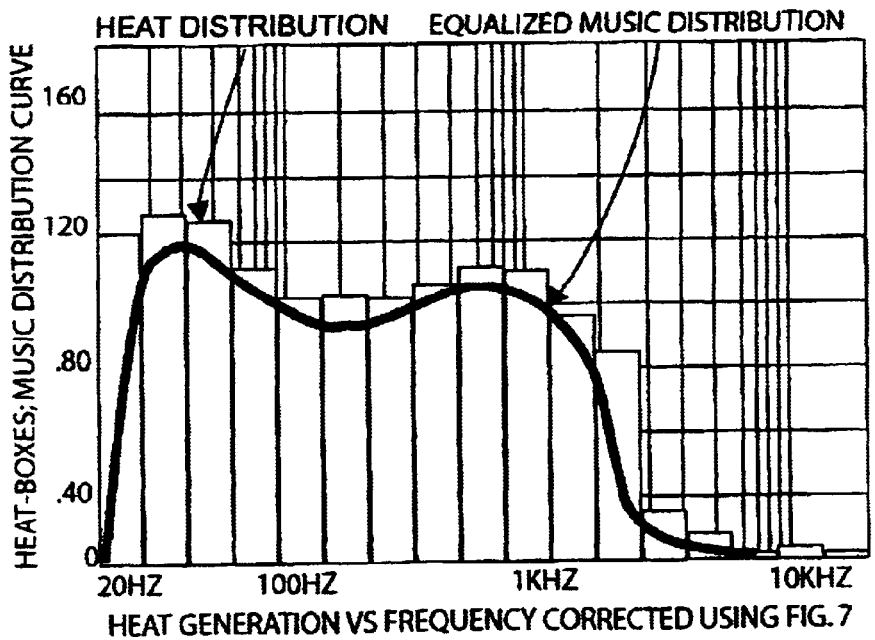
FIG. 11 is a plot that illustrates the heat generated by an amplifier where the rail voltage is equalized as in FIG. 7.

In FIGS. 10 and 11 the heat and music distribution of a non-equalized and an equalized amplifier, respectively, is illustrated. For purposes of comparison the heat distribution is shown in frequency segments that match those of the 21 equalization steps shown in FIG. 7.

FIG. 10 illustrates the response of an amplifier that varies the rail voltage of the amplifier based only on the music signal (e.g., the Hamada amplifier mentioned above). From this plot it can be seen that the rail voltage is too high below approximately 1 kHz since a rail voltage that is higher than necessary results in the excess power being dissipated as heat. Then above 1 kHz rail voltage is marginally low which results in the heat generated not matching or exceeding the music distribution curve.

FIG. 11, on the other hand, is the response of an amplifier that includes equalization for the human audio response curve. The correspondence between the heat distribution and an music distribution curve is much closer with the heat only substantially exceeding the music curve where the rise and fall of the music distribution is rapid. It is obvious that the greater the number of equalization steps, the better the match that can be achieved. Of course, the number of steps of equalization that a manufacturer provides in an amplifier will vary depending on the price range at which the amplifier is focused. Perhaps lower cost amplifiers may have four or five steps of equalization, whereas the more expensive amplifier may have many more. Regardless of the number of equalizations steps actually used in an amplifier, efficiency and distortion characteristics will be greatly improved over what is currently available.

Thus it can be seen that for audio signals under 100 Hz, the amplifier must produce higher current to drive the speakers and in that range the human hear can not detect distortion even as high as 1–10%, at 1000 Hz the human ear can detect distortion as low as 0.1–1.0%, and at 5000 Hz the ear can detect distortion at about 0.1–0.5%. The present invention takes those variations in the ability of the human ear to detect distortion at various frequencies into account to maximize the performance of the amplifier. None of the prior art amplifiers have been designed to take the needs of the audio listener into consideration. This is advantagous to the listener since the frequency response of the human ear varies with frequency, that fact having been known for many years.

Figure 1:
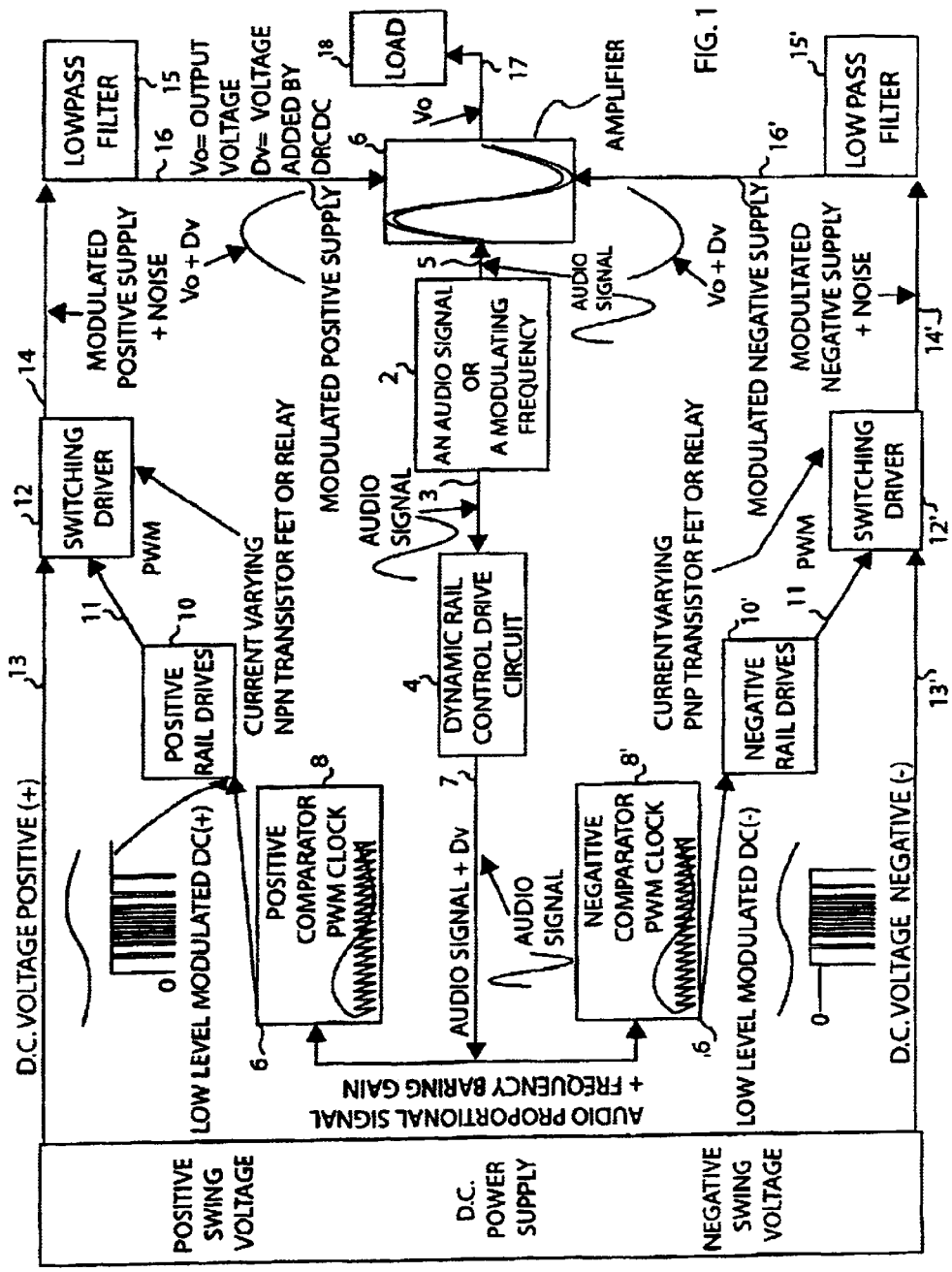
FIG. 1 is a block diagram of a first embodiment of an amplifier with dynamic rail control drive circuit of the present invention.

FIG. 1 illustrates a first embodiment of an amplifier of the present invention that includes dynamic rail control. In the central portion of the block diagram of FIG. 1 is block 2 marked audio signal or a modulating frequency. From block 2, the audio signal, $V_i$, which is a sine wave is directed on line 3 to the dynamic rail control drive circuit 4 and on line 5 to amplifier 6.

Starting with the path to the left from block 2, the dynamic rail control drive circuit 4, or dynamic rail driver circuit 4, selects a delta voltage value, $d_v$, and adds the present value of $d_v$ to the audio signal wherein $d_v$ is a function of the frequency of the audio signal.

$$d_v = F(\text{audio frequency}) \tag{1}$$

The sum of the audio signal and $d_v$ is then applied to the positive and negative comparator PWM clocks 8 and 8', respectively. It will be noticed that the upper and lower portions of FIG. 1 are virtually the same. As will become clear as the discussion progresses, $d_v$ is an amount of voltage that has been added to the feedback signal to each PWM comparator to cause the amplifier to make a signal with more voltage than absolutely necessary. In other words, the present invention pertains to a control circuit for the rail voltage, DC voltage supply of the amplifier. This control circuitry is dynamically controlled to vary the DC voltage supply to each side (upper and lower) of the amplifier based on the frequency of the audio signal.

The waveforms drawn above positive comparator PWM clock 8 is a representation of the input signal from line 7 and the output signal from PWM comparator 8 that is on line 9 with the input signal processed with a high frequency sawtooth waveform as shown within block 8. The frequency of the sawtooth clock waveform is typically several times the highest frequency possible in the audio signal. Notice that the signal on line 9 is PWM (low level modulated DC) encoded during the positive going portion of the input signal on line 7 and is a steady positive DC voltage when the input signal is negative going.

The negative comparator PWM clock 8' functions similarly to comparator 8, only in reverse. Namely, from the waveforms drawn below comparator 8' there again is a representation of the input signal from line 7 and the output signal from PWM comparator 8' that is on line 9'. Notice that the signal on line 9' is PWM encoded during the negative going portion of the input signal on line 7 and is a steady zero DC voltage when the input signal is positive going. The other blocks in the lower portion of FIG. 1, relative to the negative side of the DC power on line 13', also work similarly to the other blocks in the upper portion.

Continuing with the discussion along the upper portion of FIG. 1, the positive PWM modulated signal on line 9 is applied to positive rail drivers 10 that is a current driver. Positive rail drivers 10 takes the low level PWM modulated signal from line 9 and generates the PWM signal on line 11 that has sufficient power to drive switching driver 12.

Switching driver 12 is connected to the positive DC voltage line 13, and receives the switching signal on line 11. Switching driver 12 is a high speed switch (e.g., a transistor, relay etc.) that is switched by the PWM signal on line 11 to generate a modulated positive supply signal that also includes some noise (e.g., switching frequency noise) on line 14.

The modulated positive supply and noise signal on line 14 is then applied to low pass filter 15 that has a cut-off frequency the is sufficiently below the modulation frequency of PWM clock 8 and above the highest discernible frequency of the human ear. From the low pass filter 15, there is a modulated positive supply signal on line 16. What is meant by "modulated positive supply signal" is that it is not a fixed DC level (it varies as the frequency of the audio signal varies) to provide the necessary positive rail level that corresponds to the various variations based on the audio frequency.

The negative rail drivers 10', switching driver 12' and low pass filter 15' work in reference to the negative DC voltage from the power supply in the same way that their counter parts in the upper portion of FIG. 1. Thus on line 16' the modulated negative supply signal corresponds to the negative rail level.

The positive and negative rail levels on lines 16 and 16', respectively, are each applied to amplifier 6 to provide operational rail levels needed as the frequency of the audio signal varies. Then on line 17 the amplified audio signal, $V_o$ that is $kV_i$ is provided to the load 18 (e.g., speaker system). Within amplifier block 6 the continuous output audio signal $V_o$ is shown with the positive and negative rail voltage components spaced from the output audio signal with the spacing between the curves being $D_v$, the voltage added to the rails in response to the varying frequency of the input audio signal.

Figure 4:
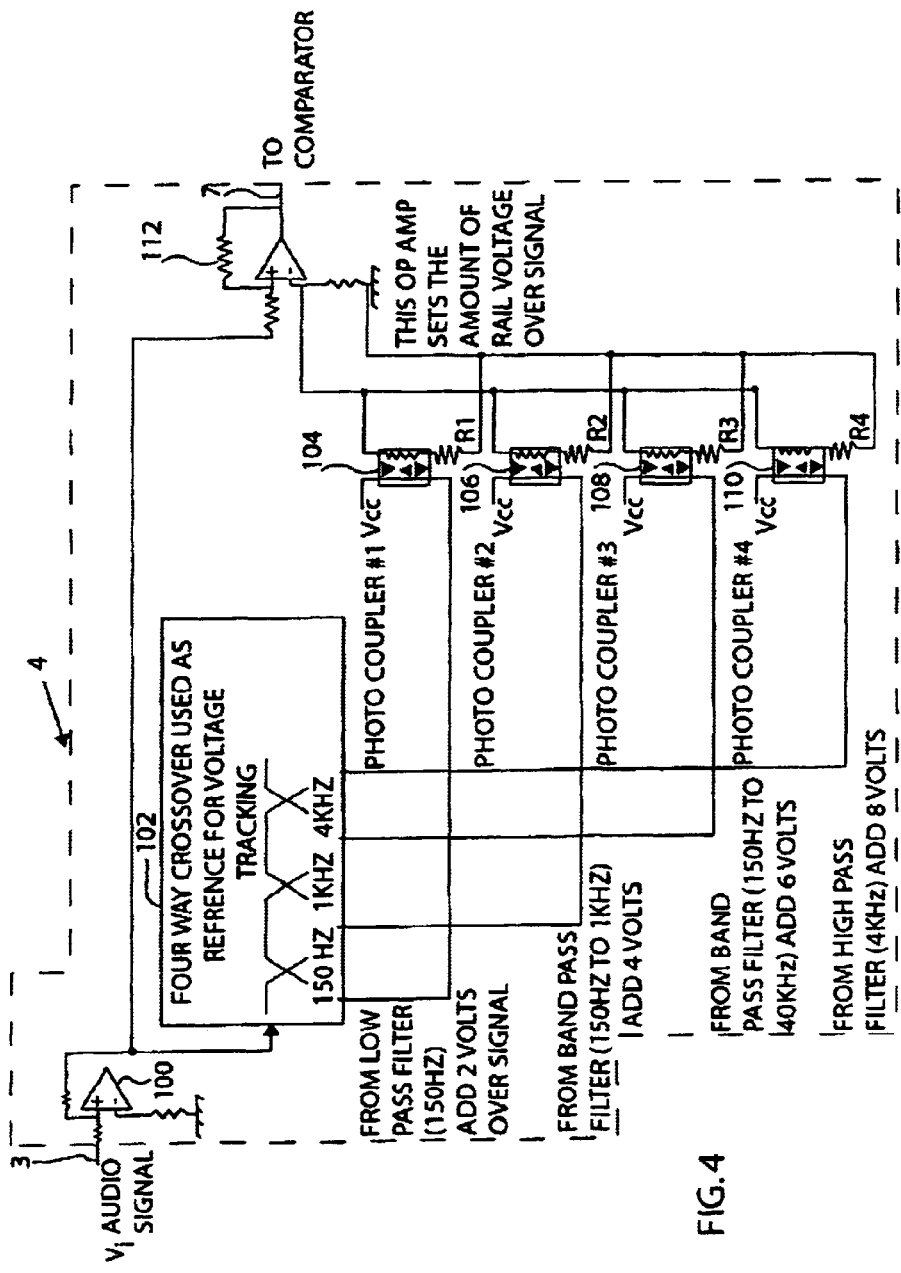
FIG. 4 is a block diagram of the dynamic rail and control drive circuit block of FIG. 1.

Referring to FIG. 4 there is shown one embodiment of the dynamic rail control drive circuit 4 of FIG. 1. The audio signal, $V_i$, on line 3 is received on the positive input terminal of input buffer 100 with the buffered signal being applied to both the positive input of rail setting amplifier 112 and the input of crossover network 102. For purposes of illustration, a four range crossover circuit for equalization is shown here with the first range being below 150 Hz, the second range being 150–1000 Hz, the third range being 1000–4000 Hz, and the fourth range being over 4000 Hz (i.e., as many ranges as desired can be used as well as an automatically, continuous variation circuit). The signals from each of the ranges of crossover network 102 are each applied to a controllable resistance device. Here each of the controllable resistance devices is a photo resistor 104, 106,108 and 110, respectively, with the corresponding signal from the crossover network applied to the LED portion of the photo resistor. The variable resistor portion (LDR) of each photo resistor is in series with another resistor, $R_1$, $R_2$, $R_3$ and $R_4$, respectively. Then each of those series resistor combination are connected in parallel with each other between the negative input terminal of rail setting amplifier 112 and the signal return, in parallel with the feedback resistor of rail setting amplifier 112. (Note: the values of resistors $R_1$, $R_2$, $R_3$ and $R_4$ could be the minimum internal resistance of photo resistors 104, 106, 108 and 110, respectfully, in which case external resistors $R_1$, $R_2$, $R_3$ and $R_4$ would not be necessary.)

In operation, as the amplitude of the signals from each of the four crossover ranges increases the light output of the LED of the corresponding photo resistor also increases thus reducing the resistive value of the variable resistor portion in proportion to the change in the light intensity. In the illustrated configuration, the values of $R_1$, $R_2$, $R_3$ and $R_4$, are each selected so that the first range of crossover network 102 causes the LER-LDR 104 and $R_1$ combination to contribute a signal equal to the first range signal plus 2 volts; the LER-LDR 106 and $R_2$ combination to contribute a signal equal to the second range signal plus 4 volts; the LER-LDR 104 and $R_3$ combination to contribute a signal equal to the third range signal plus 6 volts; and the LER-LDR 104 and $R_4$ combination to contribute a signal equal to the fourth range signal plus 8 volts, to control the rail voltage over signal value provided by rail setting amplifier 112.

Figure 2:
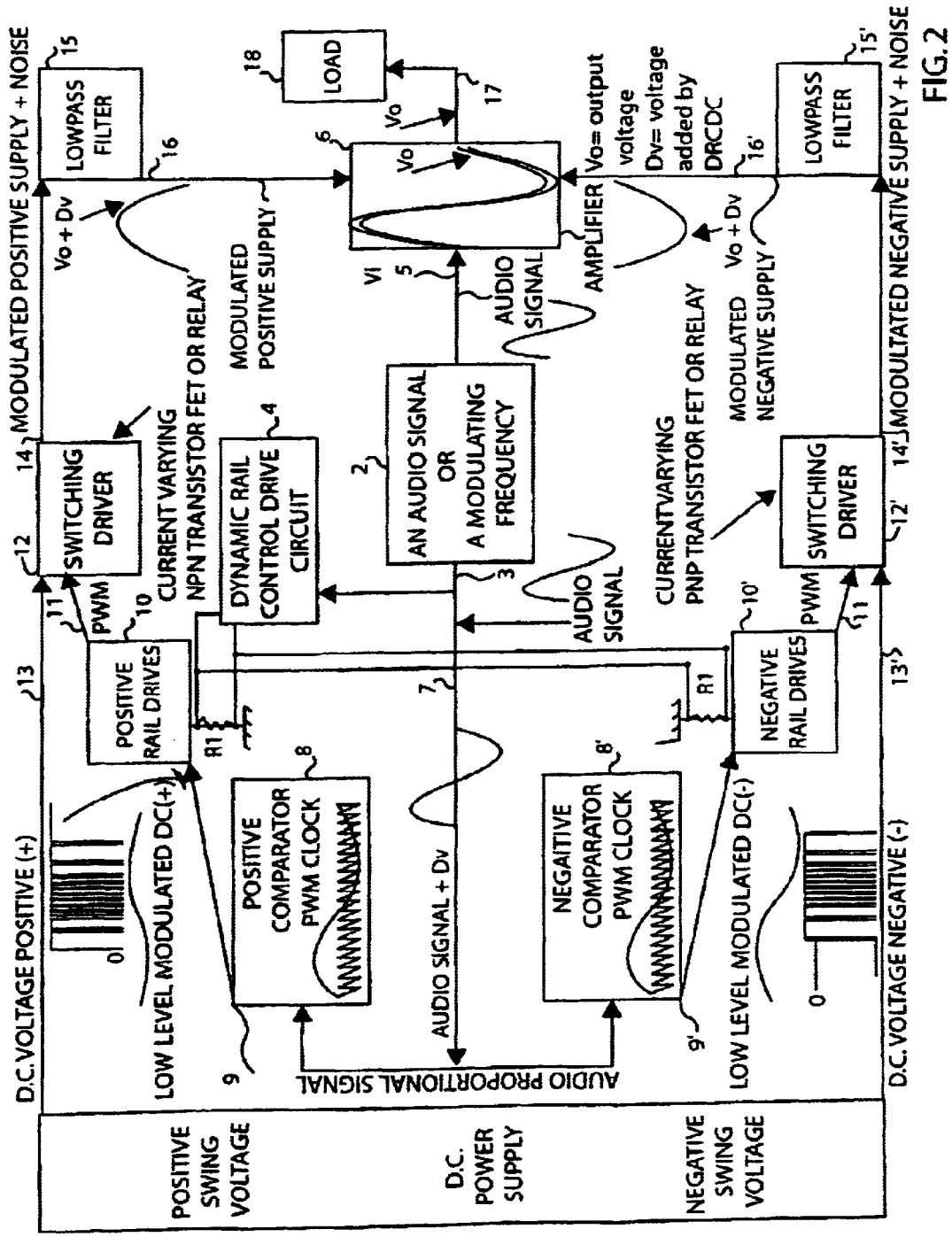
FIG. 2 is a block diagram of a second embodiment of an amplifier with dynamic rail control drive circuit of the present invention.

FIG. 2 illustrates a second embodiment of the amplifier of the present invention. The components and signal lines here that are the same as those in FIG. 1 have the same reference numbers and are connected and function in the same way as in FIG. 1, unless described differently below. The difference here is that the dynamic rail control circuit 4' controls positive and negative rail drivers 10 and 10' directly, instead of controlling the PWM comparators 8 and 8' as in FIG. 1. Thus, the audio signal from source 2 is applied to dynamic rail control drive circuit 4' (slightly different than dynamic rail control circuit 4 of FIG. 1 which will be explained in relation to FIG. 5 below) and directly to PWM comparators 8 and 8'. Additionally, each of positive and negative rail drivers is coupled to signal return through a resistor RI. In this configuration the $d_v$ to control the rail voltages is not introduced to the PWM comparators 9 and 9', but rather to positive and negative rail drivers 10 and 10'.

Figure 5:
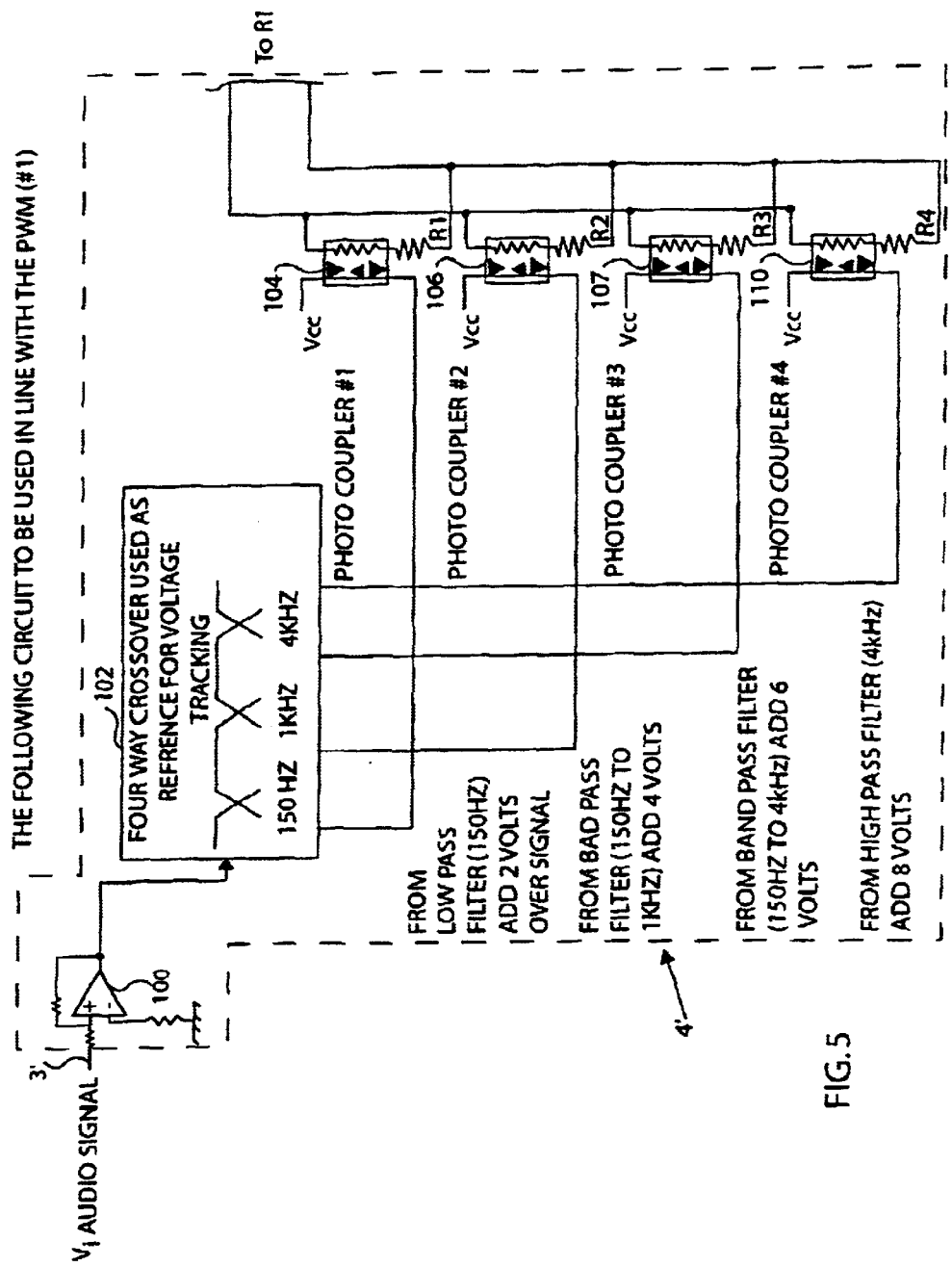
FIG. 5 is a block diagram of the dynamic rail and control drive circuit block of FIGS. 2 and 3.

Referring next to FIG. 5 where dynamic rail control circuit 4' is illustrated. It will be noticed that all of the internal components are the same, and connected to each other in the same way, as those in FIG. 4, thus they operate in the same way. The difference is in the absence of rail setting amplifier 112. In this configuration the 104-$R_1$, 106-$R_2$, 108-$R_3$ and 110-$R_4$ combinations are connected in parallel with RI, the signal source reference resistor of rail drivers 10 and 10'. (The same note relative to resistors $R_1$, $R_2$, $R_3$ and $R_4$ also applies to resistors 104-$R_1$, 106$R_2$, 108-$R_3$ and 110-$R_4$ in FIG. 4.)

Figure 3:
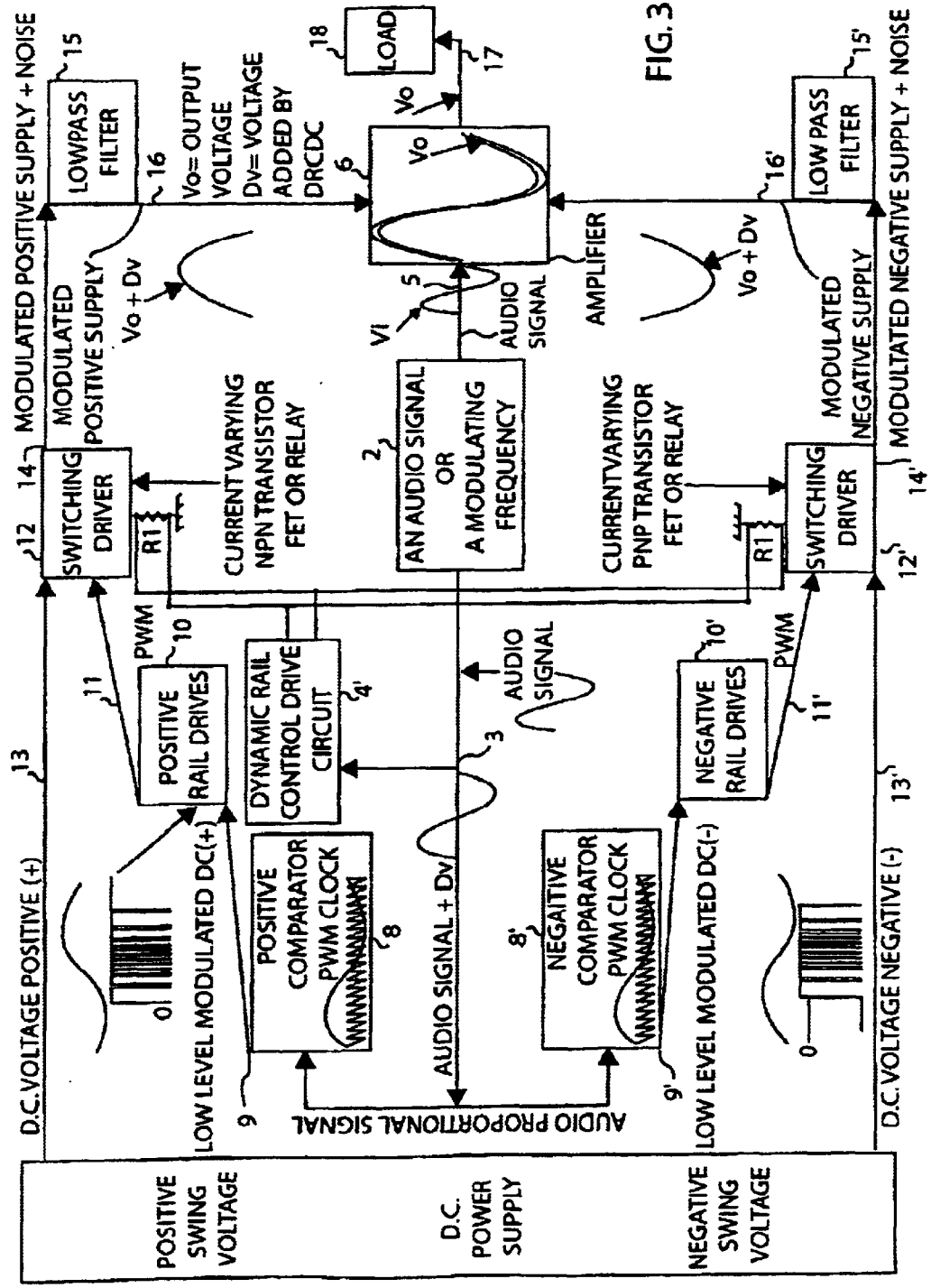
FIG. 3 is a block diagram of a third embodiment of an amplifier with dynamic rail control drive circuit of the present invention.

Now, in FIG. 3, the third embodiment of the present invention is illustrated. This embodiment is very similar to that of FIG. 2 with the only change being that the rail voltage control is introduced to switching drivers 12 and 12' instead of positive and negative rail drivers 10 and 10'. Thus, the only connection differences between FIGS. 2 and 3 is the inclusion of the signal return reference resistors, RI on switching drivers 12 and 12' instead of positive and negative rail drivers 10 and 10' and the output terminals of dynamic rail control drive circuit 4' are connected across RI in the new location. The operation of the overall circuit is substantially the same with the exception of the location where the rail variation control is inserted. In this embodiment the dynamic rail control drive circuit that is needed is also that of FIG. 5.

Figure 12:
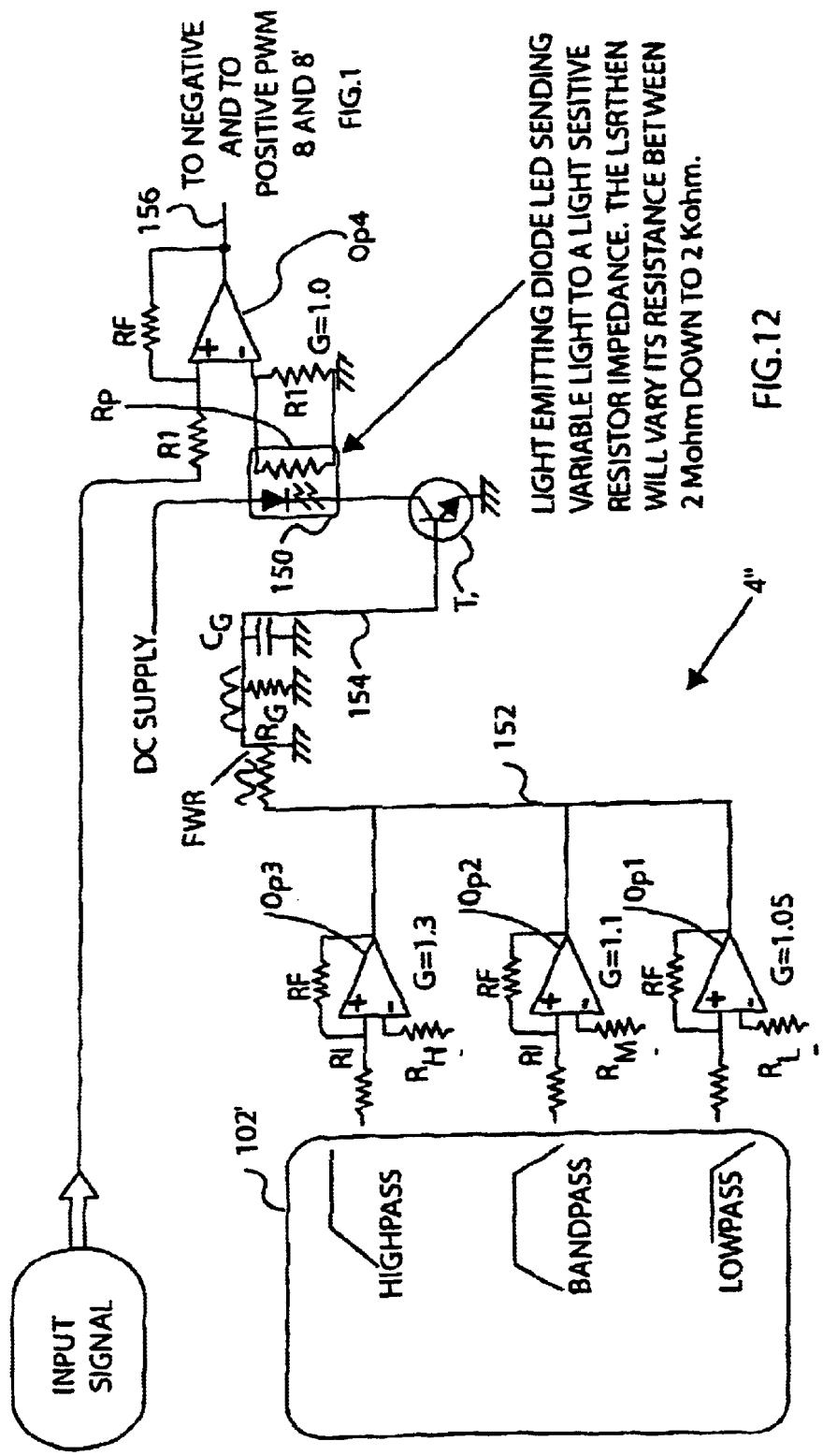
FIG. 12 is a block diagram of a fourth embodiment of an amplifier with dynamic rail control drive circuit of the present invention.

FIG. 12 is a block diagram of a fourth embodiment of an amplifier with a dynamic rail control drive circuit of the present invention. This embodiment uses a dynamic rail control drive circuit 4" that is similar to drive circuit 4 of FIG. 4. This embodiment requires fewer components to perform the same function as drive circuit 4 in FIG. 4. Here the input signal is applied to both filter network, or crossover network, 102' and op-amp $Op_4$. Associated with the lowpass section (low frequencies) is op-amp $Op_1$ that, when the input signal is a low frequency signal, sets the drive level at the lowest frequencies; here $Op_1$, is shown having a representative gain of 1.05 set by the selection of resistors $R_f$ and $R_l$ taking into consideration the balancing of distortion and efficiency for the low frequencies as discussed above. Similarly, the bandpass section, when the input signal is a mid range signal, powers op-amp $Op_2$ that sets the drive level at the mid range frequencies; here $Op_2$ is shown having a representative gain of 1.1 set by the selection of resistors $R_f$ and $R_m$ taking into consideration the balancing of distortion and efficiency for the mid range frequencies as discussed above. Additionally, the high pass section, when the input signal is a high frequency signal, powers op-amp $Op_3$ that sets the drive level at the highest frequencies; here $Op_3$ is shown having a representative gain of 1.3 set by the selection of resistors $R_f$ and $R_h$ taking into consideration the balancing of distortion and efficiency for the high frequencies as discussed above. The output signal from each of op amps $Op_1$, $Op_2$ and $Op_3$ connected in common on line 152 to deliver the signal representative of the frequency band that the frequency of the input signal falls to full wave rectifier FWR. The rectified signal on line 154 is then smoothed by the parallel combination of $R_g$ and $C_g$ to ground, and then applied to the base of transistor $T_1$. The voltage level on the base of $T_1$. determines the current level the flows through the LED section of photo resistor 150. The light emitted by the LED in turn determines the resistance of the light sensitive resistor $R_p$ with the resistive value of $R_p$ being highest when no light is emitted by the LED and the lowest when the light level emitted by the LED is highest. In a typical photo resistor of this type the resistive value of $R_p$ varies from 2 Mohms to 2 Kohms.

The final stage of the embodiment of dynamic rail control 4" is $Op_4$ with the gain determined by $R_f$ and the parallel combination of $R_1$ and $R_p$ of photo resistor 150. that is shown having a representative gain of 1.0 when the LED of photo resistor 150 is not emitting any light and thus $R_p$ being at the maximum value . Op amp $Op_4$ is indicated as having a gain of 1.0 which is true when the resistive value of $R_p$ is greatest, and higher when the resistive value of $R_p$ decreases.

Figure 13:
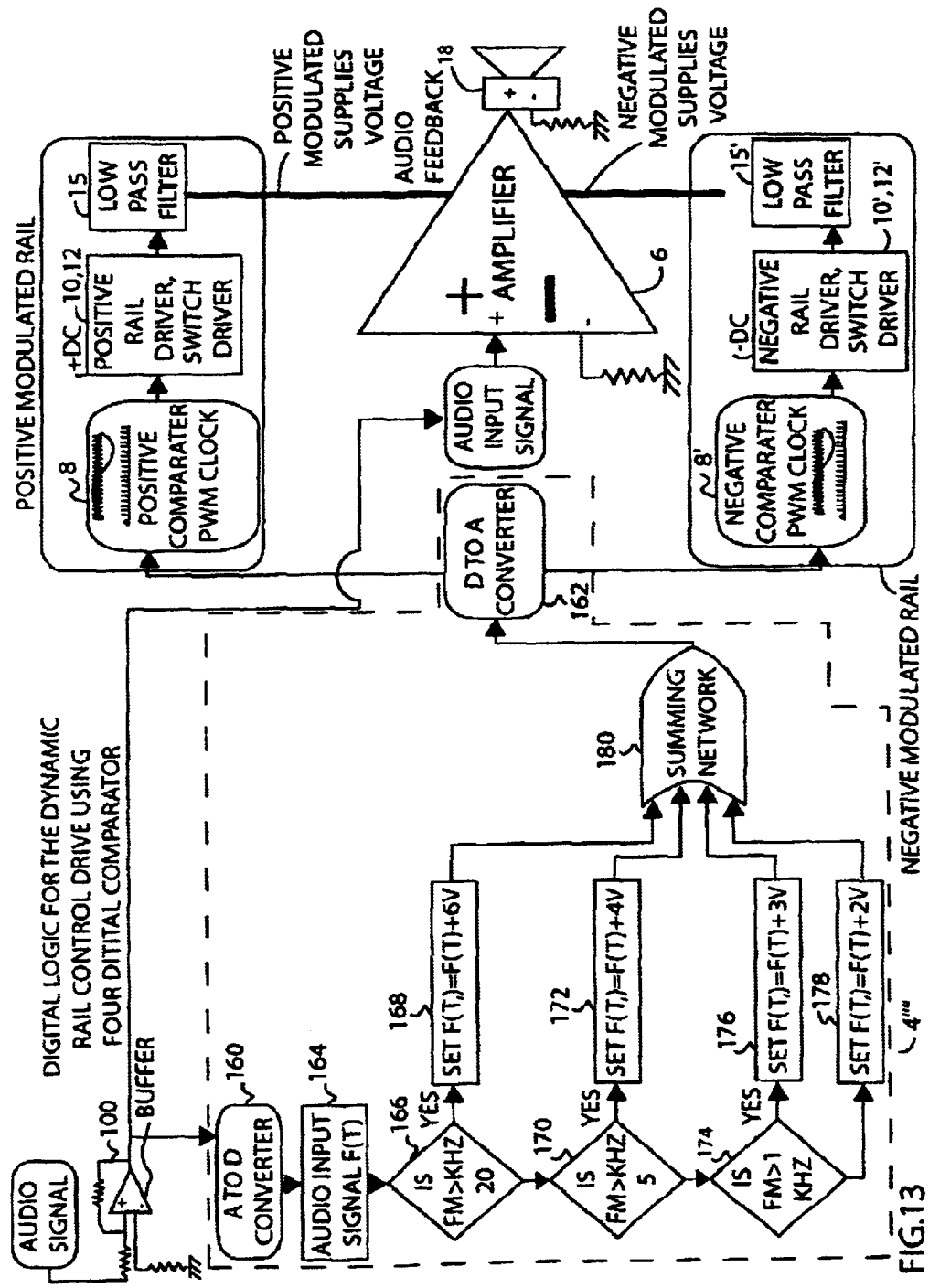
FIG. 13 is a block diagram of a fifth embodiment of an amplifier with digital dynamic rail control drive circuit of the present invention.

FIG. 13 is a block diagram of a fifth embodiment of an amplifier with digital dynamic rail control drive circuit of the present invention that is similar to the dynamic rail control drive circuit 4 of FIG. 4 with the drive voltages to be applied to the PWM comparators determined digitally. The digital dynamic rail control drive circuit is represented here by a flow chart 4'''. There are many ways to implement the digital flow shown here that are well known in the digital art operating between A-D converter and D-A converter 162. For example, the digital implementation could be done with memory and a microprocessor or a PGA (programable gate array), and many other configurations.

In operation the analog input signal received by dynamic rail control drive circuit 4''' from op amp 100 is converted by A-D converter 160 to a digital signal F(t) (164) and then it is first tested to determine if the frequency of F(t) is greater than 20 kHz (166), if so flow continues to block 168 where $F(t_1)$ is set equal to F(t)+6v with $F(t_1)$ applied to an input terminal of summing network 180. If the frequency of F(t) is less than 20 kHz, flow continues to test the frequency of F(t) to determine if it is greater than 5 kHz (170), if so flow continues to block 172 where $F(t_1)$ is set equal to F(t)+4v with $F(t_1)$ applied to a second input terminal of summing network 180. However, if the response at 170 is No, flow continues to 174 where the frequency of F(t) is tested to determine if it is greater than 1 kHz (174), if so flow continues to block 176 where $F(t_1)$ is set equal to F(t)+3v with $F(t_1)$ applied to a third input terminal of summing network 180. If the result of the test at 174 is No then the frequency is less than 1 kHz and $F(t_1)$ is set equal to F(t)+2v with $F(t_1)$ applied to a fourth input terminal of summing network 180.

From summing network 180 the $F(t_1)$ generated by 168, 172, 176 or 178 is applied to D-A converter 162 with the resulting analog version of $F(t_{1a})$ applied to each of PWM converters 8 and 8' with the remainder of the circuit in FIG. 13 operating as the same components were described as operating with respect to FIG. 1 above.

The added voltage levels in blocks 168, 172, 176 and 178 are representative of voltage levels that would be added based on the balancing of audio quality and amplifier efficiency as discussed above. The lowest voltage being added when the frequency of the audio is less than 1 kHz since distortion is much less audible and it is desired to maximize efficiency. Between 1 kHz and 5 kHz distortion is more of a concern so the voltage added is greater while still maintaining some level of efficiency to control the heat generated by the amplifier. Then between 5 kHz and 20 kHz distortion may still be somewhat of a problem, however, as will be seen below, the problem of both heat and distortion are of minimal concern since very little of a music signal that is being amplified will be above 5 kHz, the greatest voltage is added. That added voltage could be sufficient to allow the rail voltage to assume the full DC value applied to the switching drivers 12 and 12'.

In the past, Hamada took the rail voltage and created a circuit that made the rail voltage available only when the input signal needed it by using a fairly high frequency PWM clock, that clock rate being at a frequency that is much higher than the maximum audio frequency that the amplifier was designed to handle. Using such a high PWM clock frequency risks generation of excessive RFI and EMI emissions from the amplifier to provide the good sound quality that is desired.

It can be shown that in typical music, very little of the frequency of such a signal exceeds 5 kHz. Less than 10% of the music signal exceeds 5 kHz, whereas more than 50–70% of the music signal is between 300–2000 Hz. If the rail voltage is maximized for audio signals above 5 kHz, there will be some compromise in the overall efficiency of the amplifier, however, the lack of efficiency is minimal since the loss of efficiency occurs only when the music signal exceeds 5 kHz, and no more than 5–10% of the signal exceeds 5 kHz. Additionally, since higher frequency signals have a much shorted cycle time, the amplifier will be employed above 5 kHz for a far shorter time period than for signals at the lower frequencies. If more attention is directed to the lower frequencies, those less than 100 Hz or 500 Hz where the music signal is tracked much closer in those ranges where the music signal is much more likely to reside, the overall efficiency of the amplifier can be increased to much closer to 80–90%, even without tracking the higher frequencies, than the typical 40–50% range.

There is another benefit to discontinuing the modulation of the rail voltage above 5 kHz and that is that the PWM clock frequency necessary can be reduced by perhaps a factor of 4 from the PWM dock frequency currently used for amplifiers with a 20 kHz upper range while still producing good quality for signals above 5 kHz with only a small loss in overall efficiency of the amplifier while obtaining relief from the EMI and RFI problems created with the use of the higher PWM clock frequencies now in use.

While several embodiments of the present invention have been presented here to illustrate the techniques of the present invention, those embodiments have been used to illustrate the techniques of the present invention. It will be clear to anyone skilled in the art that the techniques illustrated here can be used with any amplifier that utilizes modulation to determine the rail voltage during operation of the amplifier. Further, that while the embodiments shown here each uses four equalization steps, the actual number of equalization steps is a matter of design choice and within the scope of the present invention. Additionally, while the embodiments used to illustrate the present invention used bipolar transistors, photo resistors, inductors and a digital crossover technique, the present invention could be implemented with various other types of devices including but not limited to relays, FETS, negative impedance converters and other types of variable resistors or voltage sources in lieu of the variable resistors to perform that function. Whatever specific components are used would be a matter of design choice for the application at hand and not limiting on the scope of the present invention. Thus, the present invention is not limited to only those embodiments described here. The present invention is only limited by the scope of the following claims, and any equivalents to them.

What is claimed is:

1. A dynamic rail controller for use with an audio amplifier disposed to receive a continuous input audio signal for amplification with an amplified output audio signal to be provided to a selected load with the amplifier being powered by a modulated rail voltage generated by a rail voltage modulator, said dynamic rail controller comprising:

a frequency crossover disposed to receive and continuously monitor the input audio signal as received to identify one of a plurality of predefined audio frequency bands within which a frequency of the input audio signal fits and for the duration of the frequency of the input audio signal within each of said predefined audio frequency bands the frequency cross over generates a different continuous band identifying signal that corresponds to the audio frequency band in which the frequency of the audio input signal fits; and a plurality of switching devices each coupled to receive a different one of said continuous band identifying signals, and each switching device when a corresponding continuous band identifying signal is present, provides a signal having a level related to a desired compensation for the amplified output signal portions that fall within the corresponding frequency band.

2. A method for controlling rail voltages of an audio amplifier disposed to receive a continuous input audio signal for amplification with an amplified output audio signal to be provided to a selected load with the amplifier being powered by a modulated rail voltage generated by a rail voltage modulator, said method comprising the steps of:

continuously identifying one of a plurality of predefined audio frequency bands within which the input audio signal fits as received;

generating a different continuous band identifying signal that corresponds to one of said predefined audio frequency bands in which the frequency of the audio input signal is identified for the duration of the frequency of the input audio signal within each of said predefined audio frequency bands; and selecting, in response to each of the generated continuous band identifying signals, a signal having a level related to a desired compensation for the amplified output signal portions that fall with the corresponding frequency band.

3. The dynamic rail controller of claim 1 further comprising a signal adder disposed to receive said input audio signal and coupled to said plurality of switching devices to receive each compensation signal and to continuously add the then current compensation signal to said continuous input audio signal to generate a control signal to be applied to said rail voltage modulator to select the rail voltage level corresponding to the then current frequency of the input audio signal.

4. The dynamic rail controller of claim 3 wherein said signal adder is an operational amplifier with the input audio signal applied to a first input terminal and each of the plurality of switching devices connected in parallel to a second input terminal.

5. The dynamic rail controller of claim 1 wherein each of said plurality of switching devices is a controllable resistance device.

6. The dynamic rail controller of claim 5 wherein each of said plurality of switching devices is a phot resistor having an LED source to illuminate a light sensitive resistor wherein the light sensitive resistor has a high resistance value when not illuminated and a predetermined minimum resistance when illuminated.

7. The dynamic rail controller of claim 1 wherein each of said plurality of switching devices is a controllable resistance device which are each connected in parallel with each other and in parallel with a signal return reference resistor connected to each of a positive rail driver and a negative rail driver of said rail voltage modulator.

8. The dynamic rail controller of claim 7 wherein each of said plurality of switching devices is a phot resistor having an LED source to illuminate a light sensitive resistor wherein the light sensitive resistor has a high resistance value when not illuminated and a predetermined minimum resistance when illuminated.

9. The dynamic rail controller of claim 1 wherein each of said plurality of switching devices is a controllable resistance device which are each connected in parallel with each other and in parallel with a signal return reference resistor connected to each of a first switching driver and a second switching driver of said rail voltage modulator with the first and second switching drivers attached to a positive voltage rail and a negative voltage rail, respectively, of said audio amplifier.

10. The dynamic rail controller of claim 9 wherein each of said plurality of switching devices is a phot resistor having an LED source to illuminate a light sensitive resistor wherein the light sensitive resistor has a high resistance value when not illuminated and a predetermined minimum resistance when illuminated.

11. The method as in claim 2 further comprising the step of:

adding said input audio signal together with the selected signal of the selecting step to generate a control signal to be applied to said rail voltage modulator to select the rail voltage level corresponding to the then current frequency of the input audio signal.

12. The method as in claim 2 further comprising the step of:

applying the selected signal of the selecting step across a signal return reference resistor connected to each of a positive rail driver and a negative rail driver of said rail voltage modulator.

13. The method as in claim 2 further comprising the step of:

applying the selected signal of the selecting step across a signal return reference resistor connected to each of a first switching driver and a second switching driver of said rail voltage modulator with the first and second switching drivers attached to a positive voltage rail and a negative voltage rail, respectively, of said audio amplifier.

\* \* \* \* \*